United States Patent
Yu et al.

(10) Patent No.: US 11,429,767 B2
(45) Date of Patent: Aug. 30, 2022

(54) ACCELERATOR AUTOMATION FRAMEWORK FOR HETEROGENEOUS COMPUTING IN DATACENTERS

(71) Applicant: Xilinx, Inc., San Jose, CA (US)

(72) Inventors: Cody Hao Yu, Los Angeles, CA (US); Peng Zhang, Los Angeles, CA (US)

(73) Assignee: XILINX, INC., San Jose, CA (US)

( * ) Notice: Subject to any disclaimer, the term of this patent is extended or adjusted under 35 U.S.C. 154(b) by 249 days.

(21) Appl. No.: 16/723,091

(22) Filed: Dec. 20, 2019

(65) Prior Publication Data

US 2020/0202058 A1 Jun. 25, 2020

Related U.S. Application Data

(60) Provisional application No. 62/782,875, filed on Dec. 20, 2018.

(51) Int. Cl.
| | |
|---|---|
| *G06F 9/44* | (2018.01) |
| *G06F 30/27* | (2020.01) |
| *G06F 30/34* | (2020.01) |
| *G06N 20/10* | (2019.01) |
| *G06F 9/54* | (2006.01) |
| *G06F 9/50* | (2006.01) |

(52) U.S. Cl.
CPC ............ *G06F 30/27* (2020.01); *G06F 9/5061* (2013.01); *G06F 9/544* (2013.01); *G06F 30/34* (2020.01); *G06N 20/10* (2019.01)

(58) Field of Classification Search
CPC ..................................................... G06F 9/547
USPC ........................................................ 703/13
See application file for complete search history.

(56) References Cited

U.S. PATENT DOCUMENTS

| | | | | |
|---|---|---|---|---|
| 2014/0344013 A1* | 11/2014 | Karty | ............... | G06Q 30/0201 705/7.29 |
| 2019/0286972 A1* | 9/2019 | El Husseini | ........... | G06N 3/063 |

* cited by examiner

*Primary Examiner* — Timothy A Mudrick
(74) *Attorney, Agent, or Firm* — David R. Stevens; Stevens Law Group

(57) ABSTRACT

Systems and methods for designing an information processing system are described. In one embodiment, a design space is partitioned into a plurality of independent partitions based on a defined set of rules. A unique processing core is assigned to each partition. A plurality of starting points is generated for each partition, where each starting point is associated with a machine learning algorithm. The starting points for each partition may include a performance driven seed and an area-driven seed. A set of feasible designs associated with the information processing system are determined.

18 Claims, 5 Drawing Sheets

US 11,429,767 B2

ACCELERATOR AUTOMATION FRAMEWORK FOR HETEROGENEOUS COMPUTING IN DATACENTERS

RELATED APPLICATION

This application claims the benefit of U.S. Provisional Application Ser. No. 62/782,875 entitled "An Accelerator Automation Framework for Heterogeneous Computing in Datacenters" and filed Dec. 20, 2018, which is hereby incorporated herein by reference in its entirety.

TECHNICAL FIELD

The present disclosure relates to automated systems and methods for compiling computational kernels written in a high-level programming language and translating these kernels for implementation on a computing device such as a field-programmable gate array (FPGA). The disclosure also describes automated systems and methods for performing design space exploration for computing system architectures, and translating associated design spaces for implementation on a computing device such as an FPGA.

BACKGROUND AND SUMMARY

Scalable high-performance computing applications are becoming increasingly popular due to an increase in a number of datacenters. Among various power-efficient devices, FPGAs' low power consumption and reprogrammability allow them to be used as high-performance and energy-efficient accelerators for a variety of applications. Applications with a large fraction of computationally intensive kernels, such as string matching, searching and sorting, are suitable for acceleration using FPGAs. Existing FPGA programming tools rely on programmers to develop FPGA accelerators for associated computing kernels, and a significant amount of programming effort is required for users to manually produce accelerator designs. There exists a need, therefore, for an automated system that is able to read in a characterization of a design space and produce a design file that is suitable for implementation on an FPGA.

In one embodiment, steps to design an information processing system can include partitioning a design space into a plurality of independent partitions based on a defined set of rules. A unique processing core is assigned to each partition, and a plurality of starting points is generated for each partition. In some embodiments, each starting point is associated with a machine learning algorithm. The design process determines a set of feasible designs associated with the information processing system.

An embodiment of a hardware-based system to design an information processing system includes a processing system configured to partition a design space into a plurality of independent partitions based on a defined set of rules. A plurality of processing cores associated with the processing system is configured such that each processing core is associated with a unique partition. The processing system and processing cores are configured to generate a plurality of starting points for each partition. Each starting point is associated with a machine learning algorithm, and the processing system and processing cores are configured to determine a set of feasible designs associated with the information processing system.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

The systems and methods described herein enable a design and implementation of information processing systems such as those used in datacenters. These systems and methods implement an automated framework that compiles computational kernels to software-defined accelerators for implementations on processing devices such as FPGA accelerators. Automated generation of software-hardware integration interfaces is also performed by the systems and methods described herein. The system and methods disclosed herein may be understood with the approach described in "S2FA: An Accelerator Automation Framework for Heterogeneous Computing in Datacenters," Cody Hao Yu, Peng Wei, Max Grossman, Peng Zhang, Vivek Sarker, Jason Conig, Proceedings of the 55$^{th}$ Annual Design Automation Conference (DAC), San Francisco, Calif., Jun. 24-28, 2018, which is hereby incorporated herein by reference in its entirety for all purposes.

Figure 1:
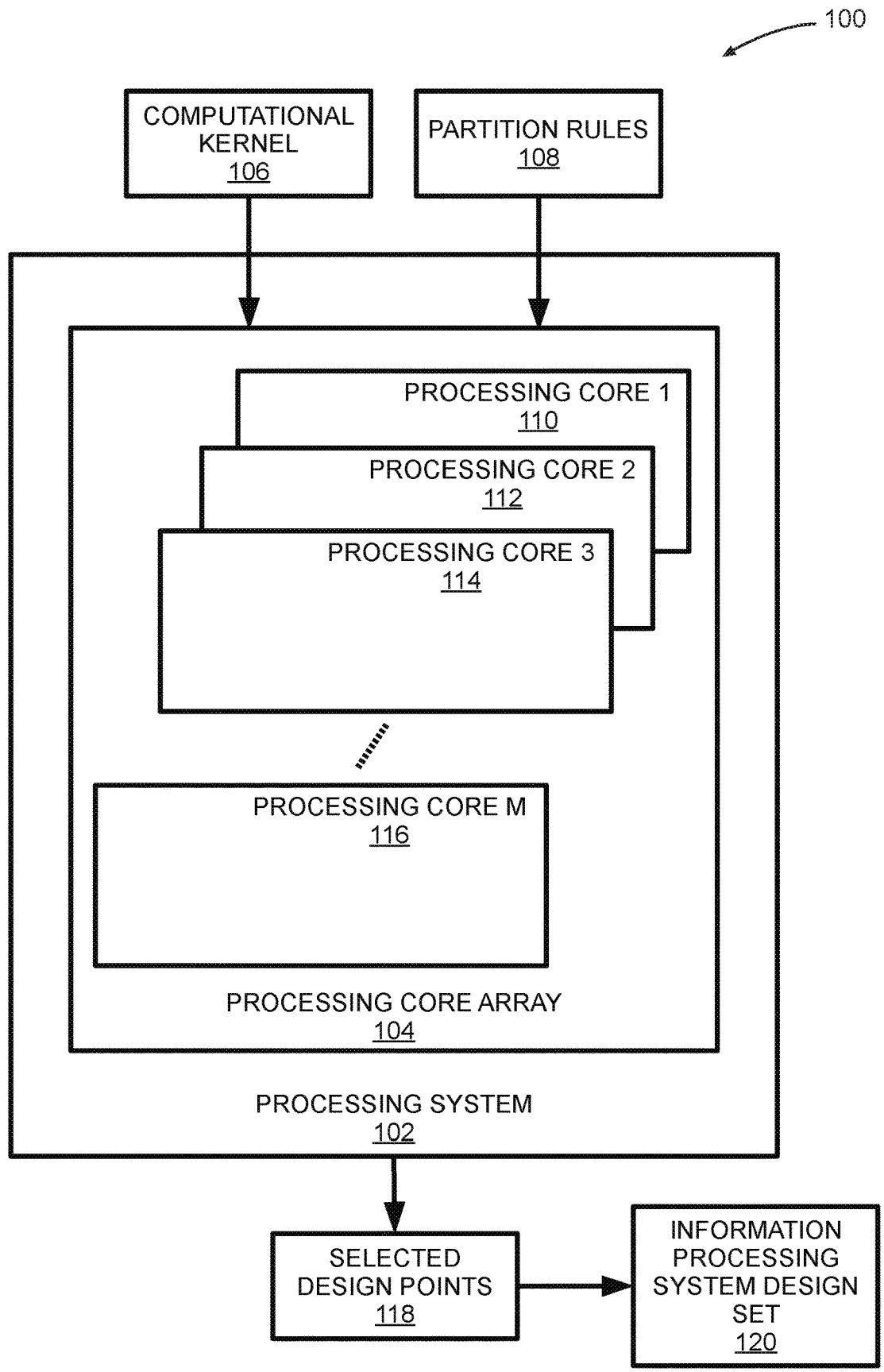
FIG. 1 is a block diagram depicting an embodiment of a hardware system configured to design an information processing system.

FIG. 1 is a block diagram depicting an embodiment of a hardware system 100 that is configured to design an information processing system. In some embodiments, hardware system 100 includes a processing system 102 that includes a processing core array 104. Processing core array 104 further includes a plurality of processing cores—a processing core 1 110, a processing core 2 112, a processing core 3 114, through a processing core M 116. In some embodiments, processing core array 104 receives a computational kernel 106 and partition rules 108. Computational kernel 106 is a characterization of a design associated with the information processing system. In some embodiments, computational kernel 106 is implemented in a programming language such as C or C++, Java, or Scala.

In some embodiments, partition rules 108 include a set of rules that are used to partition a design space of possible optimizations of the computational kernel 106 into a plurality of distinct partitions. These partitions are generated using methods described herein. Each partition is assigned to a unique processing core from processing core 1 110 through processing core M 116 that are included in processing core array 104.

In some embodiments, processing system 102 generates selected design points 118 that are used as starting points for a prospective design set which, in turn, form a basis for an information processing system design set 120 that includes a set of feasible designs for the required information processing system.

Figure 2:
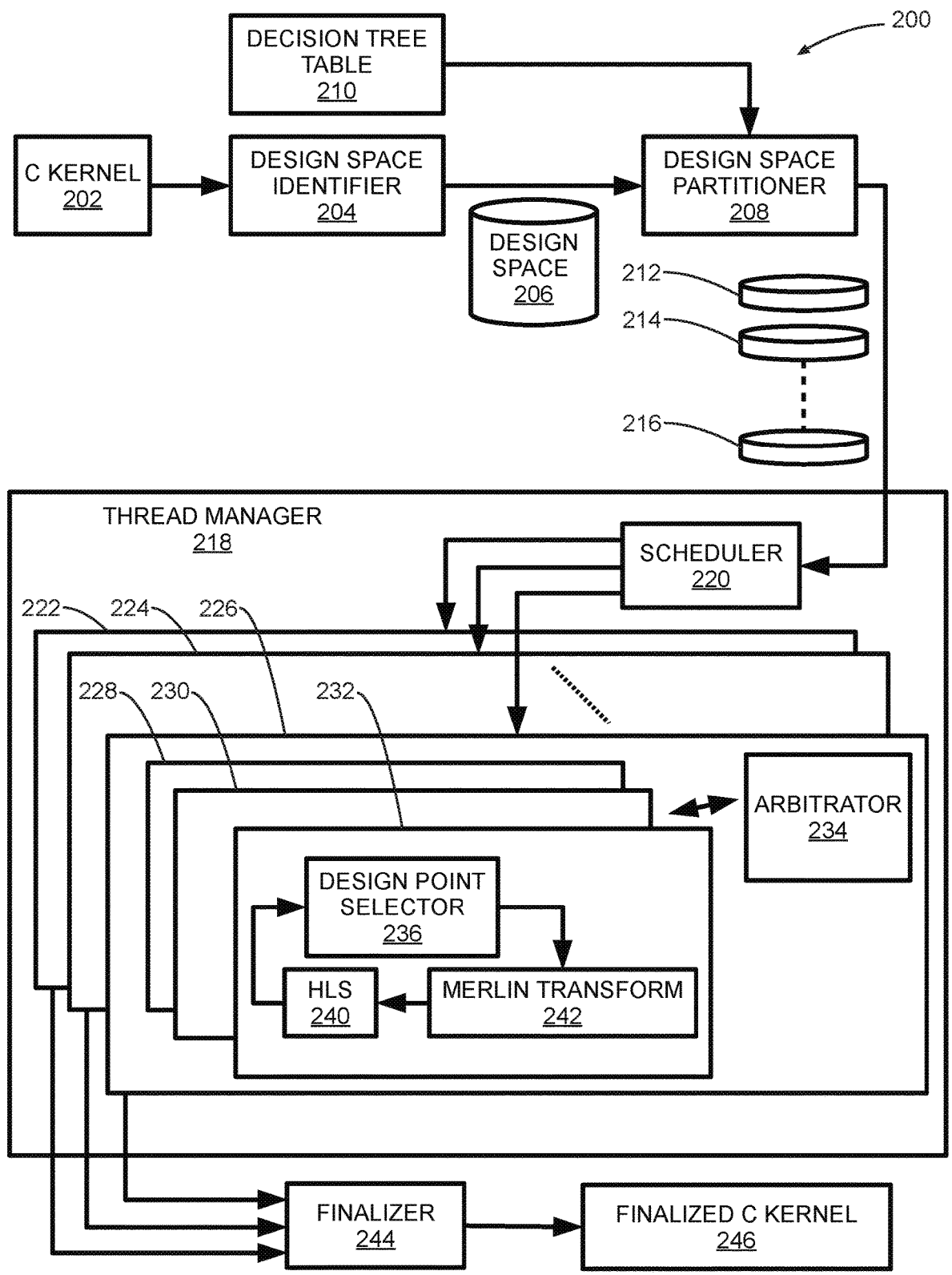
FIG. 2 is a block diagram depicting an embodiment of a workflow associated with a design of an information processing system.

FIG. 2 is a block diagram depicting an embodiment of a workflow 200 associated with a design of an information processing system. In some embodiments, workflow 200 is implemented using hardware system 100 and its associated subcomponents.

Designing of an information processing system that entails translating a system characterized in a programming language such as C/C++ to, for example, an FPGA bitstream is a challenging task. Specifically, the following two impediments have to be overcome:

Impediment 1: Expensive Evaluation Approach:

In order to cover all possible user-written kernels in a design framework, contemporary high-level synthesis tools such as the Xilinx Sdx can take several minutes to evaluate one design point, so only tens of design points can be evaluated in one hour. This leads to long compile times to get a meaningful set of feasible design points.

Impediment 2: Complex Factor Dependencies:

Many design space factors have high dependency on each other. For example, enabling fine-grained pipelining to a nested loop causes all included sub-loops to be fully unrolled. This results in an invalidation of corresponding design space factors. This phenomenon might confuse a learning algorithm that is configured to perform an evaluation on the design space, so the algorithm has to spend more iterations on realizing such dependencies.

Furthermore, some architectural designs may contain more than a thousand trillion design points. This makes it impractical to explore such a tremendous design exhaustively. An automated design space exploration, therefore is an important aspect of the design space exploration process.

Workflow 200 includes features and design parameters that address the above two impediments. In some embodiments, a starting point in workflow 200 is a C kernel 202 that captures a high-level design architecture associated with the information processing system. In some embodiments, C kernel 202 may be implemented using another high-level programming language such as C++, JAVA, SCALA, or the like. A design space identifier 204 takes in the design architecture captured by C kernel 202, and generates a design space 206 that is used as a basis for designing the information processing system.

For example, there may be a given set of pragmas that may be implemented to improve the performance of the C kernel. There may be various code portions of the C kernel, each code portion having a set of applicable pragmas that may be applied to that portion. Accordingly, the design space is each possible modified version of the C kernel, with each version being a unique combination of replacements (or non-replacement) for the code portions of the C kernel. Examples of pragmas that may be implemented for a particular C kernel may include those listed in Table 1. In particular, all combinations of values in the ranges of values for each factor of Table 1 at each portion of the C kernel to which they may be applied constitute the design space in some embodiments.

TABLE 1

Example Design Space Definition

| Factor | Design Space (Values) |
|---|---|
| Buffer bit-width | $\{b\|bw(B) \in \mathbb{B}, 8 < b = 2^n < 512\}$ |
| Loop tiling | $\{t\|t = T(L) \in \mathbb{L}, 1 < t < TC(L)\}$ |
| Loop parallel (course-/fine-grained) | $\{u\|u = UF(L) \in \mathbb{L}, 1 < u < TC(L)\}$ |
| Loop pipeline (couarse-/fine-grained) | $\{p\|p = P(L) \in \mathbb{L}, p \in \{on, off, flatten\}\}$ |

A design space partitioner 208 reads in design space 206 and data from a decision tree table 210. In some embodiments, decision tree table 210 is configured to generate and implement a decision tree structure associated with design space 206. Decision tree is a popular method for classification and regression, and is implemented by decision tree table 210. Each tree node represents a rule that is composed of a parameter and a condition (e.g., parallel factor<16). A path from the tree root to a leaf with all rules on the path are conjugated to form a partition. These nodes are determined by greedily selecting the best rule to increase, e.g., maximize, the information gain.

In other embodiments of workflow 200, the decision tree structure may be replaced by other methodologies to partition a design space, such as random, hashing, entropy, and so on.

In some embodiments, design space partitioner 208 is configured to statically partition design space 206 into a plurality of design space partitions such as a design space partition 212, a design space partition 214, through a design space partition 216. The output design space partitions (i.e., design space partition 212 through design space partition 216) generated at the output of design space partitioner 208 are input to a thread manager 218 that includes subcomponents configured to process design space partition 212 through design space partition 216 as described herein.

In some embodiments, each of design space partition 212 through design space partition 216 is a distinct partition of design space 206, and each of design space partition 212 through design space partition 216 is assigned to a unique processing core of hardware system 100. In other words, each of design space partition 212 through design space partition 216 is uniquely assigned to one of processing core 1 110 through processing core M 116. In some embodiments, assignment (i.e., temporal scheduling) of each of design space partition 212 through design space partition 216 to a processing core or an associated processing thread in thread manager 218 is done on a first-come-first-served basis. This assignment holds as long as a number of design space partitions is greater than or equal to a number of processing cores. This process of assignment or scheduling is performed by a scheduler 220 that is included in thread manager 218.

In some embodiments, scheduler 220 generates a plurality of outputs, with each output associated with a particular design space partition. Each output of scheduler 220 is received by an instance of a runtime environment that implements a domain-specific program tuner. In some embodiments, a program tuner implements reinforcement learning algorithms to process the design space partitions. Examples of learning algorithms include uniform greedy mutation, differential evolution genetic algorithm, particle swarm optimization, and simulated annealing. These reinforcement learning algorithms are configured to perform design space exploration (DSE).

In selected embodiments, an iterative searching engine is used as a program tuner of choice. The searching engine iteratively finds better design points within the user-given time limit. In some embodiments, multiple instances of the searching engine are instantiated in thread manager 218, such as a first instantiation 222, a second instantiation 224, through an $R^{th}$ instantiation 226. Each of first instantiation 222 through $R^{th}$ instantiation 226 have a similar structure, as described herein.

In some embodiments, $R^{th}$ instantiation 226 includes an arbitrator 234 that is configured to determine a plurality of next working learning algorithm instances—a first learning algorithm instance 228, a second learning algorithm instance 230, through an $N^{th}$ learning algorithm instance 232. In some embodiments, arbitrator 234 may be implemented using a multi-armed bandit algorithm to judge an effectiveness of each search technique and prioritize the learning algorithms with better performance according to the judgment. The algorithm that can efficiently find high-quality design points will be rewarded and prioritized in the future search, and vice versa. Arbitrator 234 may also be configured to determine stopping criteria as discussed herein.

In some embodiments, any combination of learning algorithms described above or other learning algorithms may be used to implement first learning algorithm instance 228 through $N^{th}$ learning algorithm instance 232. In particular embodiments, each of first learning algorithm instance 228 through $N^{th}$ learning algorithm instance 232 have similar structures. As shown in FIG. 2, learning algorithm instance 232 includes a design point selector 236 that is configured to select one or more design points for processing. In some embodiments, outputs from design point selector 236 are received by a Merlin Transform 242. Merlin Transform 242 is associated with a library that provides a set of pragmas for useful code transformations such as loop tiling, tree reduction, coarse-grained parallelism, and so forth. As discussed herein, hardware system 100 analyzes C kernel 202 associated with and inserts pragmas with possible values to construct an associated design space. The design space will then be explored by a DSE approach. In addition, for the design point selected by the DSE, hardware system 100 as depicted by workflow 200 executes a Merlin compiler for code transformation and evaluates the transformed kernel by estimating the performance and resource utilization using high-level synthesis (HLS) of the associated Xilinx SDx. However, performing HLS for each design point is time-consuming, so a parallel learning-based design space exploration approach is implemented to address this issue, as discussed herein. In some embodiments, a Merlin code transformation attempts to apply fine-grained pipelining to a nested loop by fully unrolling all its sub-loops.

In some embodiments, high-level synthesis (HLS) is performed by an HLS 240, the output of which loops back to design point selector 236. In this way, an iterative feedback loop is setup that determines one or more design architectures for a desired information processing system. A plurality of design sets output by each of first instantiation 222 through $R^{th}$ instantiation 226 of the searching engine is output to a Finalizer 244 that finalizes these designs for implementation. Specifically, Finalizer 224 outputs one or more substantially optimal design sets, from among first instantiation 222, through $R^{th}$ instantiation 226 of the searching engine. Outputs from Finalizer 244 comprise a finalized C kernel 246 that includes finalized architectural designs for an information processing system.

Since the learning algorithms utilized in workflow 200 are iterative algorithms that have a strong dependency between iterations, DSE efficiency cannot simply be increased using more CPU cores to address Impediment 1. As a result, the design space is statically separated into independent partitions and different processing cores are assigned to different partitions to perform the DSE in parallel, as discussed above. As shown in FIG. 2, workflow 200 has a mechanism that adopts a first-come-first-serve approach to schedule partitions to threads, so it addresses solves Impediment 1 as long as the partition number is larger than or equal to the number of CPU cores.

Rules for designing an information processing system using workflow 200 includes the following set of rules associated with the DSE process.

Partition the Design Space Based on Loop Hierarchy in Order to Reflect the Design Factor Dependency (Addresses Impediment 2):

According to observations, a similar loop level could have similar impact on performance even in different applications, so an attempt is made to partition the design space based on the loop level. However, it is impractical to build application-specific loop-level based rules without any training data. As a result, an approach that groups applications with similar loop hierarchy geometrically is used to generate training data and to establish the rules.

Partition the Design Space According to Resilient Distributed Dataset (RDD) Transformation Semantics Such as Map and Reduce as Implemented in Apache Spark:

In detail, a rule is defined based on the scheduling of the outermost loop in kernels, since the outermost loop in kernels is always inserted by a bytecode-to-C compiler to achieve the equivalent functionality as the corresponding parallel pattern. With the rules obtained from above methodologies, the rules are determined and ranked by building a binary decision tree that clusters the design points which potentially have similar resource utilization or latency so that the learning process can be more efficient. A decision tree is a popular method for classification and regression. Each tree node represents a rule that is composed of a parameter and a condition (e.g., parallel factor<16). A path from the tree root to a leaf with all rules on the path are conjugated to form a partition. These nodes are determined by greedily selecting the best rule to maximize the information gain. A path from the tree root to a leaf with all rules on the path are conjugated to form a partition. These nodes are determined by greedily selecting the best rule to maximize the information gain. Formally, nodes are chosen from the set argmax$_n$ IG(n,D), where IG(n,D) is the information gain if node n is applied to a dataset D, further defined as follows:

$$IG(n, D) = Imp(D) - \frac{N_l}{N} \times Imp(D_l) - \frac{N_r}{N} \times Imp(D_r)$$

where $N_l$, $N_r$, N are a size of a left partition subset $D_l$, right partition subset $D_r$, and overall dataset D respectively. Imp(D) is an impurity measurement of dataset D. An impurity function is usually selected based on the type of decision tree task (classification or regression). Since the value of each partition in this case is a regressed number (latency), variance is chosen as an impurity function. With partitions from a decision tree, Impediment 2 can be efficiently alleviated because the learning algorithm is able to learn information without being disturbed by out tiers. It is important to note that since all partitions are disjoint and the union of all partitions is the original design space, the design space partition approach preserves the optimality while improving the DSE efficiency.

Seed Generation:

Although the design space has been partitioned systematically in the previous section, a partition may still contain millions of design points. However, it is too aggressive to prune the design space using heuristics such as limiting parallel factor or local buffer size, because the boundary of those factors varies from arbitrary user-written kernels and results in a different infeasible region in the design space.

For instance, performing coarse-grained parallelism with factor 256 to the outermost loop might be infeasible for most designs due to high routing complexity, but it could be an optimal choice for certain designs that have a very simple computational pattern. As a result, instead of heuristic pruning, an entire design space is preserved while increasing a probability of finding the best design point in fewer iterations by providing seeds, the starting point for learning algorithms. For each partition with different strategies, two seeds are generated. The first seed is performance-driven. For this seed, pipelining is enabled for all loops, a parallel factor of every loop is set to a predefined maximum parallelization value (e.g., 32), and a buffer bit-width is set to a maximum buffer width (e.g., 512). Although this configuration might fail to be synthesized for some designs, an iteration number of the DSE process for others can be significantly reduced. On the other hand, the second seed is area-driven. For this seed, all optimizations are disabled so all loops are performed sequentially and all off-chip buffers are set to the minimum bit-width. As a result, this seed has the most conservative configuration in terms of resource utilization and design complexity, so it is less likely to be infeasible from the perspective of the high-level synthesis tool. With the conservative seed as one of two starting points explored in parallel, the learning algorithm is guaranteed to start searching in the feasible region and avoid being trapped in the infeasible region all the time.

Early Stopping Criteria:

Adopting a limitation of either execution time or searched point count cannot avoid a long tail problem. In fact, the long tail becomes a serious problem for exploring FPGA accelerator designs because minutes to an hour may be needed to evaluate a single design point using HLS.

To solve the long tail problem without the knowledge of optimal performance, one more criteria may be included in addition to the time limit to stop the DSE process earlier based on the following concept. According to the dataset of explored results $D_i$ after i iterations, and its subset of the uphill performance results between any two consecutive iterations $D_i^u$, let $P_{D_i}(D_i^u \setminus t_j)$ be the experimental conditional probability by mutating design factor $t_j$, and let $P(t_j)$ be the theoretical probability with equal likelihood to other factors. Any early stopping criteria function should converge when $P_{D_i}(D_i^u \setminus t_j)$ is close enough to $P(t_j)$. $H(D_i)$—the Shannon entropy, a widely used approach in information theory for quantifying uncertainty—is used to formulate this concept. That means the DSE process will terminate for a partition at iteration i if there exists a low enough uncertainty of finding a better result in that partition at the next iteration. Formally, any early stopping criteria with the Shannon entropy may be defined as follows:

$$|H(D_i) - H(D_{i-1})| \leq \theta$$

$$H(D_i) = -\Sigma_j P_{D_i}(D_i^u \setminus t_j) \log P_{D_i}(D_i^b \setminus t_j)$$

where θ is the threshold for termination. In practice, the DSE process is terminated after the entropy difference is lower than θ for consecutive N iterations to avoid pulses. In some embodiments, determining an appropriate stopping condition is performed by design point allocator 234.

Figure 3:
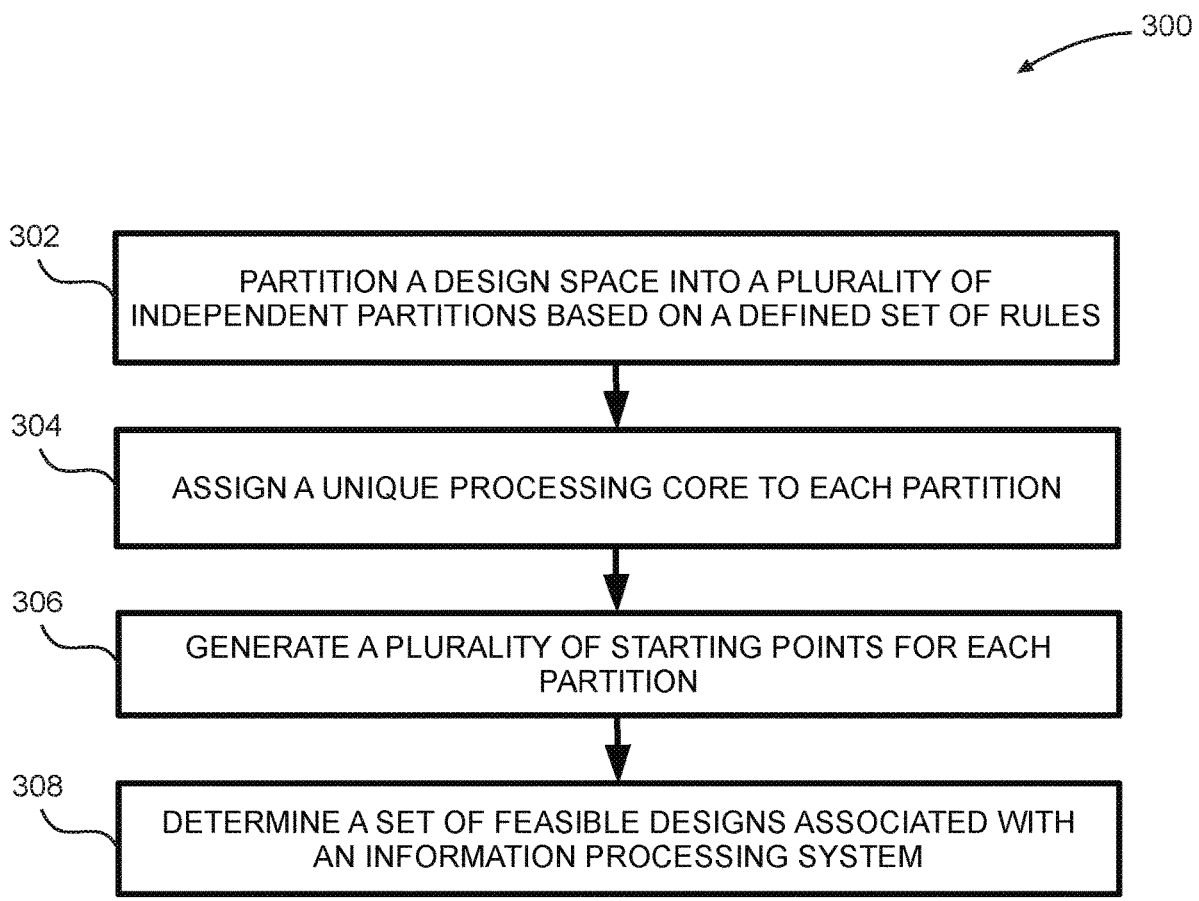
FIG. 3 is a flow diagram depicting an embodiment of a method to design an information processing system.

FIG. 3 is a flow diagram depicting an embodiment of a method 300 to design an information processing system. At 302, the method partitions a design space into a plurality of independent partitions based on a defined set of rules, as described herein. Examples of independent partitions may include design space partition 212 and design space partition 214. In some embodiments, the method statically creates sets of rules and chooses the set that is most suitable to the design for partitioning only at the beginning of a DSE process. Other rules include partitioning the design space based on loop hierarchy or RDD transformation semantics, as described herein. Next, at 304, the method assigns a unique processing core to each partition, as described herein. At 306, the method generates a plurality of starting points (i.e., seeds, for each partition). Finally, at 308, the method determines a set of feasible designs associated with an information processing system.

Figure 4:
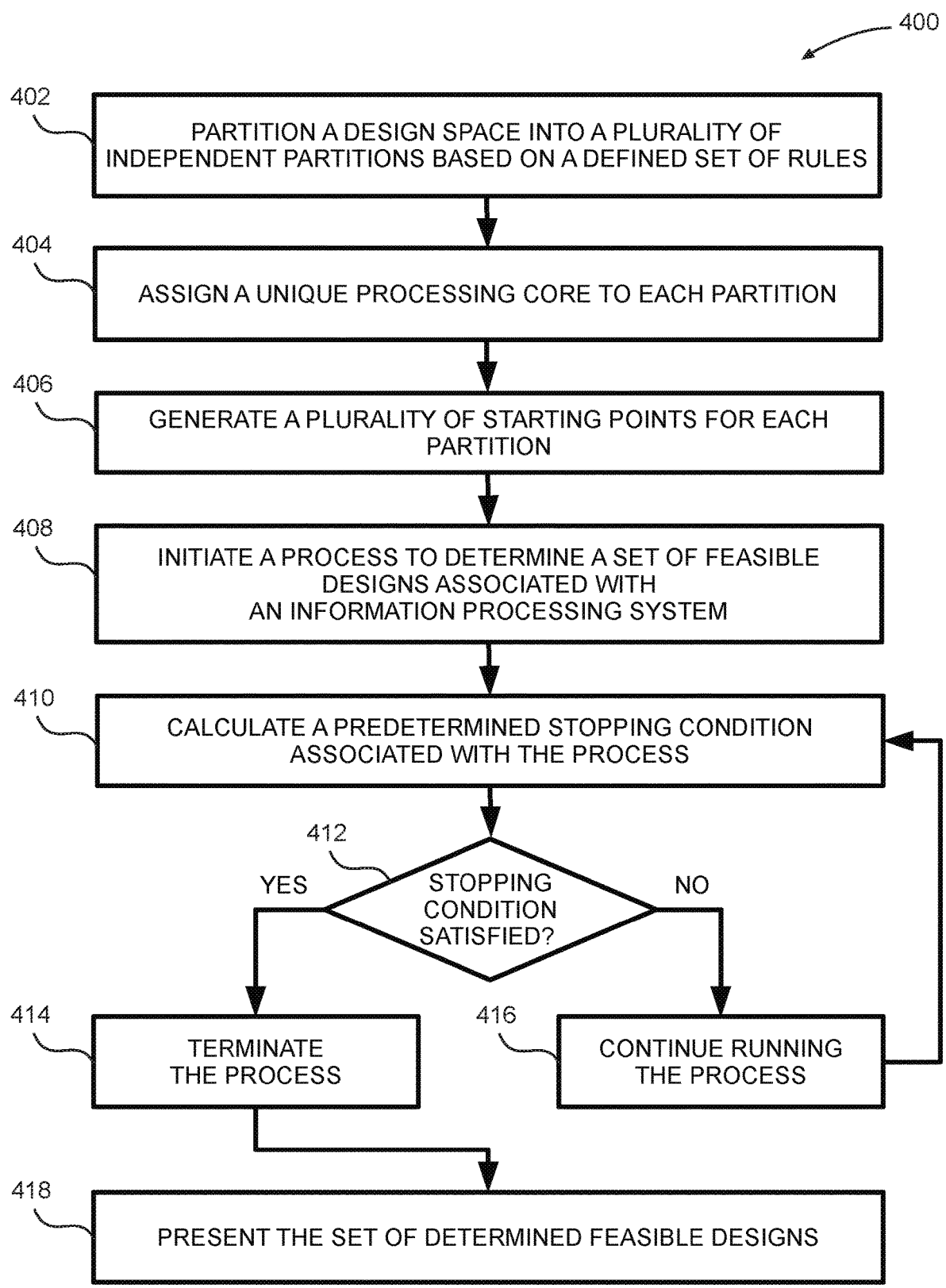
FIG. 4 is a block diagram depicting another embodiment of a method to design an information processing system.

FIG. 4 is a block diagram depicting another embodiment of a method 400 to design an information processing system. At 402, the method partitions a design space into a plurality of independent partitions based on a defined set of rules, as described herein. Examples of independent partitions may include design space partition 212 and design space partition 214. In some embodiments, the method statically creates sets of rules and chooses the set that is most suitable to the design for partitioning only at the beginning of a DSE process. Other rules include partitioning the design space based on loop hierarchy, as described herein. Next, at 404, the method assigns a unique processing core to each partition, as described herein. At 406, the method generates a plurality of starting points (i.e., seeds, for each partition). At 408, the method initiates a process to determine a set of feasible designs associated with an information processing system. At 410, the method calculates a predetermined stopping condition associated with the process. An example of a stopping condition using a Shannon entropy associated with the system design is described herein. Next, at 412, the method checks to see if the stopping condition is satisfied. If the stopping condition is not satisfied, the method goes to 416, where it continues running the process, and returns back to 410. On the other hand if, at 412, the stopping condition is satisfied, then the method goes to 414 where the method terminates the process. Finally, the method presents the set of determined feasible designs (to, for example, a user) at 418.

Figure 5:
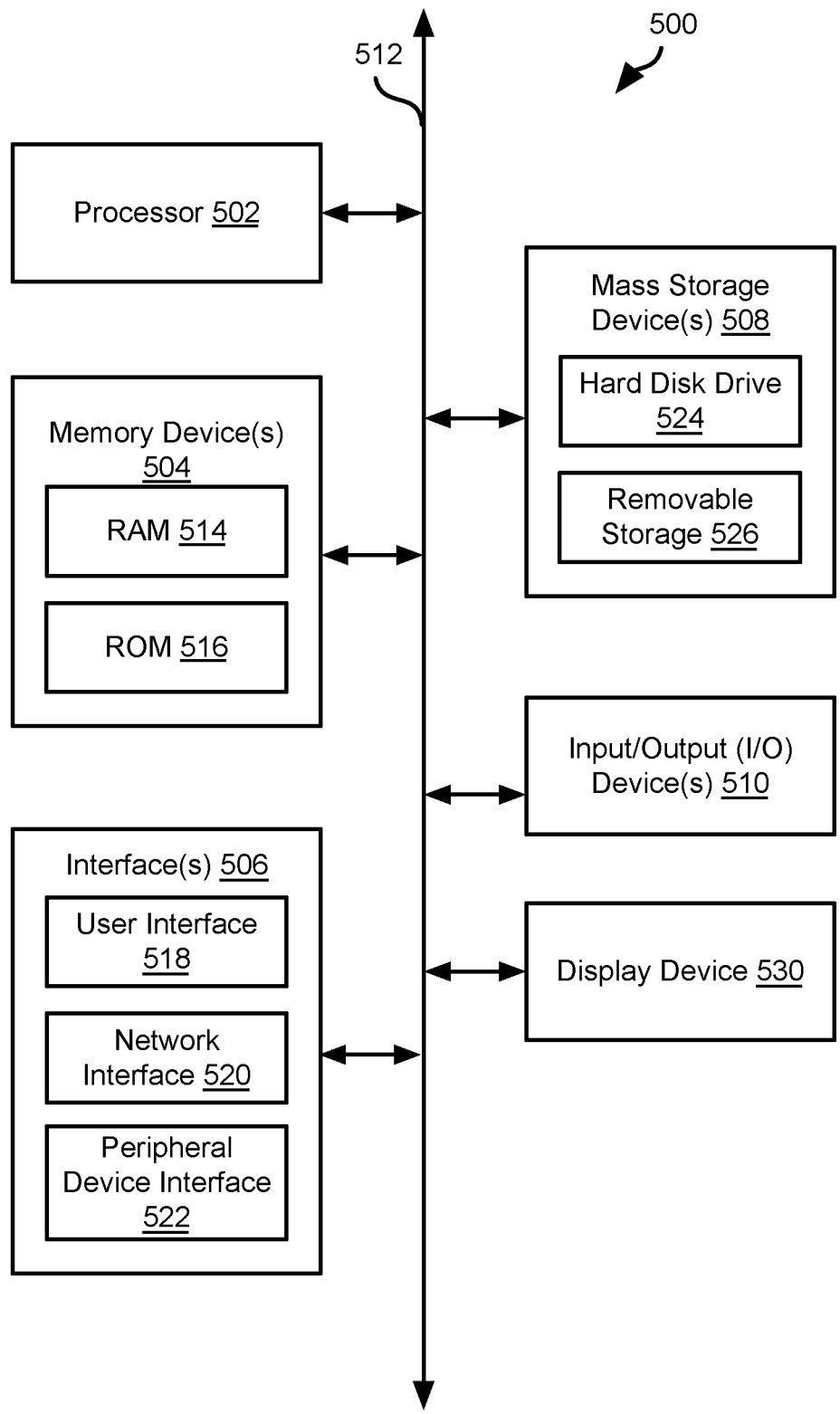
FIG. 5 is a block diagram of a computing device that may be used to implement the methods disclosed herein.

FIG. 5 is a block diagram illustrating an example computing device 500 which can be used to implement the system and methods disclosed herein. In some embodiments, a cluster of computing devices interconnected by a network may be used to implement any one or more components of the invention.

Computing device 500 may be used to perform various procedures, such as those discussed herein. Computing device 500 can function as a server, a client, or any other computing entity. Computing device can perform various monitoring functions as discussed herein, and can execute one or more application programs, such as the application programs described herein. Computing device 500 can be any of a wide variety of computing devices, such as a desktop computer, a notebook computer, a server computer, a handheld computer, tablet computer and the like.

Computing device 500 includes one or more processor(s) 502, one or more memory device(s) 504, one or more interface(s) 506, one or more mass storage device(s) 508, one or more Input/Output (I/O) device(s) 510, and a display device 530 all of which are coupled to a bus 512. Processor(s) 502 include one or more processors or controllers that execute instructions stored in memory device(s) 504 and/or mass storage device(s) 508. Processor(s) 502 may also include various types of computer-readable media, such as cache memory.

Memory device(s) 504 include various computer-readable media, such as volatile memory (e.g., random access memory (RAM) 514) and/or nonvolatile memory (e.g., read-only memory (ROM) 516). Memory device(s) 504 may also include rewritable ROM, such as Flash memory.

Mass storage device(s) 508 include various computer readable media, such as magnetic tapes, magnetic disks, optical disks, solid-state memory (e.g., Flash memory), and so forth. As shown in FIG. 5, a particular mass storage device is a hard disk drive 524. Various drives may also be included in mass storage device(s) 508 to enable reading from and/or writing to the various computer readable media. Mass storage device(s) 508 include removable media 526 and/or non-removable media.

I/O device(s) 510 include various devices that allow data and/or other information to be input to or retrieved from computing device 500. Example I/O device(s) 510 include cursor control devices, keyboards, keypads, microphones, monitors or other display devices, speakers, printers, network interface cards, modems, lenses, CCDs or other image capture devices, and the like.

Display device 530 includes any type of device capable of displaying information to one or more users of computing device 500. Examples of display device 530 include a monitor, display terminal, video projection device, and the like.

Interface(s) 506 include various interfaces that allow computing device 500 to interact with other systems, devices, or computing environments. Example interface(s) 506 include any number of different network interfaces 520, such as interfaces to local area networks (LANs), wide area networks (WANs), wireless networks, and the Internet. Other interface(s) include user interface 518 and peripheral device interface 522. The interface(s) 506 may also include one or more user interface elements 518. The interface(s) 506 may also include one or more peripheral interfaces such as interfaces for printers, pointing devices (mice, track pad, etc.), keyboards, and the like.

Bus 512 allows processor(s) 502, memory device(s) 504, interface(s) 506, mass storage device(s) 508, and I/O device(s) 510 to communicate with one another, as well as other devices or components coupled to bus 512. Bus 512 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 500, and are executed by processor(s) 502. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

While various embodiments of the present disclosure are described herein, it should be understood that they are presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the described exemplary embodiments, but should be defined only in accordance with the following claims and their equivalents. The description herein is presented for the purposes of illustration and description. It is not intended to be exhaustive or to limit the disclosure to the precise form disclosed. Many modifications and variations are possible in light of the disclosed teaching. Further, it should be noted that any or all of the alternate implementations discussed herein may be used in any combination desired to form additional hybrid implementations of the disclosure.

In this disclosure, reference is made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general-purpose computer, special purpose computer, or special purpose processing device to perform a certain function or group of functions. The computer executable instructions may be, for example, binaries, intermediate format instructions such as assembly language, or even source code. Although the subject matter is described in language specific to structural features and/or methodological acts, it is to be understood that the subject matter defined in the appended claims is not necessarily limited to the described features or acts described herein. Rather, the described features and acts are disclosed as example forms of implementing the claims.

Those skilled in the art will appreciate that the disclosure may be practiced in network computing environments with many types of computer system configurations, including, an in-dash vehicle computer, personal computers, desktop computers, laptop computers, message processors, handheld devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed herein may comprise computer hardware, software, firmware, or any combination thereof to perform at least a portion of their functions. For example, a sensor may include computer code configured to be executed in one or more processors and may include hardware logic/electrical circuitry controlled by the computer code. These example devices are provided herein purposes of illustration and are not intended to be limiting. Embodiments of the present disclosure may be implemented in further types of devices, as would be known to persons skilled in the relevant art(s).

At least some embodiments of the disclosure are directed to computer program products comprising such logic (e.g., in the form of software) stored on any computer useable medium. Such software, when executed in one or more data processing devices, causes a device to operate as described herein.

The invention claimed is:

1. A method for designing an information processing system comprising the steps of:
    partitioning a design space of possible modifications to a source code into a plurality of independent partitions based on a defined set of rules;
    assigning a unique processing core to each partition;
    generating a plurality of starting points for each partition, wherein each starting point is associated with a machine learning algorithm; and
    determining a set of feasible designs associated with the information processing system;
    wherein the plurality of starting points include a performance-driven seed and an area-driven seed; and
    wherein the design space comprises a range of values for buffer width, a range of values for loop tiling, a range of values for loop parallelization, and whether or not loop pipelining is enabled.

2. The method of claim 1, wherein the design space is partitioned based on loop hierarchy associated with the source code.

3. The method of claim 1, wherein the design space is partitioned based on an outermost kernel loop associated with the source code.

4. The method of claim 1, wherein the design space is partitioned according to a machine learning model trained to associated design points of the design space to a partition of the plurality of independent partitions according to similarity in at least one of resource utilization and latency.

5. The method of claim 1, wherein a set of feasible designs is determined using an iterative searching engine.

6. The method of claim 1, further comprising terminating a process to determine the set of feasible designs based on a predetermined stopping condition.

7. The method of claim 6, wherein the stopping condition is determined by computing a Shannon entropy associated with the design space.

8. The method of claim 1, wherein the performance-driven seed is one in which pipelining is enabled for all loops of the source code.

9. The method of claim 1, wherein the performance-driven seed is one in which parallelization for each loop of the source code is set to a predefined maximum parallelization value.

10. The method of claim 9, wherein the performance-driven seed is one in which a buffer width is set to a predefined maximum buffer width.

11. The method of claim 10, wherein the area-driven seed includes all loops of the source code performed sequentially and the buffer width set to a minimum bit width.

12. A system comprising:
    one or more processing devices; and
    one or more memory devices operably coupled to the one or more processing devices and storing executable code that, when executed by the one or more processing devices, causes the one or more processing devices to:
        partition a design space of possible modifications to a source code into a plurality of independent partitions based on a defined set of rules;
        assign a unique processing core to each partition;
        generate a plurality of starting points for each partition, wherein each starting point is associated with a machine learning algorithm; and
        determine a set of feasible designs for an information processing system based on the source code;
    wherein the plurality of starting points for each partition include a performance-driven seed and an area-driven seed;
    wherein the design space comprises a range of values for buffer width, a range of values for loop tiling, a range of values for loop parallelization, and whether or not loop pipelining is enabled;
    wherein the performance-driven seed is one in which pipelining is enabled for all loops of the source code, parallelization for each loop of the source code is set to a predefined maximum parallelization value, and a buffer width is set to a predefined maximum buffer width.

13. The system of claim 12, wherein the executable code, when executed by the one or more processing devices, further causes the one or more processing devices to partition the design space based on loop hierarchy associated with the source code.

14. The system of claim 12, wherein the executable code, when executed by the one or more processing devices, further causes the one or more processing devices to partition the design space based on an outermost kernel loop associated with the source code.

15. The system of claim 12, wherein the executable code, when executed by the one or more processing devices, further causes the one or more processing devices to partition the design space according to a machine learning model trained to associated design points of the design space to a partition of the plurality of independent partitions according to similarity in at least one of resource utilization and latency.

16. The system of claim 12, wherein the executable code, when executed by the one or more processing devices, further causes the one or more processing devices to determine the set of feasible designs using an iterative searching engine.

17. The system of claim 12, wherein the area-driven seed includes all loops of the source code performed sequentially and the buffer width set to a minimum bit width.

18. A non-transitory computer-readable medium storing executable code that, when executed by one or more processing devices, causes the one or more processing devices to:
partition a design space of possible modifications to a source code into a plurality of independent partitions based on a defined set of rules;
assign a unique processing core to each partition;
generate a plurality of starting points for each partition, wherein each starting point is associated with a machine learning algorithm; and
determine a set of feasible designs for an information processing system based on the source code;
wherein the design space is partitioned based on a loop hierarchy associated with the source code, the loop hierarchy including a plurality of levels of nested loops.

* * * * *